US007109648B2

(12) United States Patent
Menkara et al.

(10) Patent No.: US 7,109,648 B2
(45) Date of Patent: Sep. 19, 2006

(54) LIGHT EMITTING DEVICE HAVING THIO-SELENIDE FLUORESCENT PHOSPHOR

(75) Inventors: Hisham Menkara, Mableton, GA (US); Christopher Summers, Atlanta, GA (US); Brent K. Wagner, Marietta, GA (US)

(73) Assignee: Phosphortech Inc., Lithia Springs, GA (US)

( * ) Notice: Subject to any disclaimer, the term of this patent is extended or adjusted under 35 U.S.C. 154(b) by 312 days.

(21) Appl. No.: 10/801,082

(22) Filed: Mar. 15, 2004

(65) Prior Publication Data

US 2005/0023963 A1 Feb. 3, 2005

Related U.S. Application Data

(63) Continuation-in-part of application No. 10/661,931, filed on Sep. 15, 2003, now Pat. No. 6,987,353.

(60) Provisional application No. 60/492,008, filed on Aug. 2, 2003.

(51) Int. Cl.
*H05B 33/14* (2006.01)
*C09K 11/56* (2006.01)

(52) U.S. Cl. .................. 313/503; 252/301.6 S

(58) Field of Classification Search ............ 313/503; 252/301.6 S
See application file for complete search history.

(56) References Cited

U.S. PATENT DOCUMENTS

| 4,512,911 A | 4/1985 | Kotera et al. ........ 252/301.4 H |
| 4,661,419 A | 4/1987 | Nakamura .................. 428/691 |
| 5,140,604 A | 8/1992 | Alablanche et al. ........... 372/41 |
| 5,198,679 A | 3/1993 | Katoh et al. .............. 250/484.4 |
| 5,505,986 A * | 4/1996 | Velthaus et al. ............... 427/66 |
| 5,602,445 A | 2/1997 | Solanki et al. .............. 313/503 |
| 5,648,181 A | 7/1997 | Watanabe .................... 428/689 |
| 5,677,594 A * | 10/1997 | Sun et al. .................... 313/503 |
| 5,698,857 A | 12/1997 | Lambert et al. ......... 250/483.1 |

(Continued)

*Primary Examiner*—Nimeshkumar D. Patel
*Assistant Examiner*—Matt Hodges
(74) *Attorney, Agent, or Firm*—Christopher J. Whewell

(57) ABSTRACT

Provided herein are novel phosphors useful in the manufacture of white light emitting diodes. The phosphors provided by the invention are described by the formulae:

$$MA_2(S_xSe_y)_4:B$$

and/or $$M_2A_4(S_xSe_y)_7:B$$

in which x, and y are each independently any value between 0 and 1, including 0 and 1 subject to the proviso that the sum of x and y is equal to any number in the range of between about 0.75 and about 1.25; M is at least one of Be, Mg, Ca, Sr, Ba, Zn; A is at least one of Al, Ga, In, Y, La, and Gd; and wherein the activator(s), B, comprises one or more element selected from the group consisting of: Eu, Ce, Cu, Ag, Al, Tb, Cl, Br, F, I, Mg, Pr, K, Na, and Mn, including mixtures comprising any two, any three, any four, any five, any six, any seven, or more of these elements in any proportion, and wherein the elements in these mixtures may each independently be present in any amount between 0.0001% and about 10% in mole percent based on the total molar weight of said composition.

Standard techniques used in phosphor deposition for the manufacture of light emitting diodes which comprise phosphors may be employed to produce LED's having a white light output when the phosphors of the invention are utilized.

42 Claims, 6 Drawing Sheets

U.S. PATENT DOCUMENTS

| | | | |
|---|---|---|---|
| 5,998,925 A | 12/1999 | Shimizu et al. | 313/503 |
| 6,006,582 A | 12/1999 | Bhandari et al. | 73/23.2 |
| 6,066,861 A | 5/2000 | Hohn et al. | 257/99 |
| 6,153,971 A | 11/2000 | Shimizu et al. | 313/486 |
| 6,255,670 B1 | 7/2001 | Srivastava et al. | 257/89 |
| 2002/0064682 A1* | 5/2002 | Yano et al. | 428/690 |
| 2002/0105266 A1* | 8/2002 | Juestel et al. | 313/512 |
| 2005/0156510 A1* | 7/2005 | Chua et al. | 313/501 |

* cited by examiner

LIGHT EMITTING DEVICE HAVING THIO-SELENIDE FLUORESCENT PHOSPHOR

CROSS-REFERENCE TO RELATED APPLICATIONS

This application is a Continuation-In-Part of U.S. patent application Ser. No. 10/661,931 filed on Sep. 15, 2003, now U.S. Pat. No. 6,987,353, and to U.S. provisional patent application Ser. No. 60/492,008 filed on Aug. 2, 2003, the entire contents of both of which are herein incorporated fully by reference thereto.

TECHNICAL FIELD

The present invention relates generally to solid-state light-emitting devices. More particularly, it relates to light emitting diodes and the like which comprise improved solid state materials having enhanced performance and efficiency over similar devices of the prior art.

BACKGROUND INFORMATION

There have been few major improvements in conventional lighting (i.e. incandescent, halogen, and fluorescent lamps) over the past 20 years. However, in the case of light emitting diodes ("LEDs"), operating efficiencies have been improved to the point where they are replacing incandescent and halogen lamps in traditional monochrome lighting applications, such as traffic lights and automotive taillights. This is due in part to the fact that LEDs have many advantages over conventional light sources that include long life, ruggedness, low power consumption, and small size. LEDs are monochromatic light sources, and are currently available in various colors from UV-blue to green, yellow, and red. Furthermore, due to LEDs' narrow-band emission characteristics, a white color LED can only be produced by: 1) arranging individual red, green, and blue (R, G, B) LEDs closely together and then diffusing and mixing the light emitted by them; or 2) combining a short-wave UV or blue LED with broadband fluorescent compounds that convert part or all of the LED light into longer wavelengths.

When creating a white LED using the first approach described above, several problems arise due to the fact that the R, G, B light emitting devices are made of different semiconductor materials, which require different operating voltages and, therefore, complex driving circuitry. Another disadvantage arises from the low color-rendering characteristic of the resulting white light due to the monochromatic nature of the R, G, B LED emissions.

The second approach for producing white light from LEDs is in general more preferred, since it only requires a single type of LED (either UV or blue) coated with one or more fluorescent materials, thereby making the overall construct of a white light producing LED more compact, simpler in construction, and lower in cost versus the former alternative. Furthermore, the broadband light emission provided by most fluorescent materials or phosphors allows the possibility of high color-rendering white light.

A recent breakthrough in the efficiency of UV/blue LEDs has resulted in phosphor-coated blue LEDs becoming a serious contender for conventional incandescent bulbs used in the current illumination and display backlighting applications. Most of the current commercially available devices work by converting a portion of the blue LED emission to yellow. In such a situation, some of the blue light from the LED is transmitted through the phosphor and mixed with the yellow phosphor emission, thereby resulting in a perceived white light. Many workers have delved in the field of phosphors as evidenced by the following US patents, which are expressly incorporated by reference.

U.S. Pat. No. 4,512,911 discloses a rare earth element activated complex halide phosphor represented by the formula:

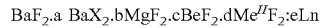
$BaF_2.a\ BaX_2.bMgF_2.cBeF_2.dMe^{II}F_2:eLn$ wherein X is at least one halogen selected from the group consisting of chlorine, bromine and iodine; $Me^{II}$ is at least one divalent metal selected from the group consisting of: calcium and strontium; Ln is at least one rare earth element selected from the group consisting of: divalent europium ($Eu^{2+}$), cerium ($Ce^{3+}$) and terbium ($Tb^{3+}$), and a is in the range between 0.90 and 1.05, b is in the range of 0 to 1.2; c is in the range of between 0 and 1.2, and d is defined by the sum of c+d being in the range of between 0 and 1.2, and $BeF_2$ is present in an amount sufficient to effect a phosphor exhibiting a higher luminance than said phosphor absent $BeF_2$ when stimulated by light of a wavelength ranging from 450 to 800 nm after exposure to X-rays.

U.S. Pat. No. 4,661,419 teaches a cerium activated rare earth halophosphate phosphor having the formula:

$LnPO_4.aLnX_3:xCe^{3+}$ in which Ln is at least one rare earth element selected from the group consisting of Y, La, Gd and Lu; X is at least one halogen selected from the group consisting of F, Cl, Br and I; and a and x are numbers satisfying the conditions of $0.1<a<10.0$ and $0<x<0.2$, respectively and exhibiting a higher stimulated emission upon excitation with a He—Ne laser of a wavelength 632.8 nm after exposure to X-rays at 80 KVp, than the phosphor wherein a is less than 0.1.

U.S. Pat. No. 5,140,604 provides mixed single-phase strontium and lanthanide oxide with a magnetolead type crystalline structure having the formula (I):

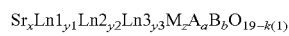
$Sr_xLn1_{y1}Ln2_{y2}Ln3_{y3}M_zA_aB_bO_{19-k(1)}$ in which Ln1 represents at least one trivalent element selected from lanthanum, gadolinium and yttrium; Ln2 represents at least one trivalent element selected from neodymium, praseodymium, erbium, holmium and thulium; Ln3 represents an element selected from bivalent europium or trivalent cerium with retention of electric neutrality by virtue of oxygen holes; M represents at least one bivalent metal selected from magnesium, manganese, and zinc; A represents at least one trivalent metal selected from aluminum and gallium; B represents at least one trivalent transition metal selected from chromium and titanium; x, y1, y2, y3, z, a, b and k represent numbers so that $0<x<1$, $0<y1<1$, $0<y2<1$, $0<y3<1$, $0<z<1$, $10.5<a<12$, $0<b<0.5$ and $0<k<1$ provided that $0<x+y1+y2+y3<1$ and that $11<z+a+b<12$.

U.S. Pat. No. 5,198,679 teaches a divalent europium activated alkaline earth metal halide phosphor having the formula:

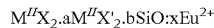
$M^{II}X_2.aM^{II}X'_2.bSiO:xEu^{2+}$ in which $M^{II}$ is at least one alkaline earth metal selected from the group consisting of Ba, Sr and Ca; each of X and X' is at least one halogen selected from the group consisting of Cl, Br and I, and X is not the same as X'; a and x are numbers satisfying the conditions of $0.1<a<10.0$ and $0<x<0.2$, respectively; and b is a number satisfying the condition of $0<b<3$ X10⁻². Two halogens are present in this composition, whereas your proposed composition only contains one halogen, fluorine.

U.S. Pat. No. 5,602,445 teaches a bright, short wavelength blue-violet phosphor for electro luminescent displays comprises an alkaline-based halide as a host material and a rare earth as a dopant. The host alkaline chloride can be chosen from the group II alkaline elements, particularly $SrCl_2$ or $CaCl_2$, which, with a europium or cerium rare earth dopant, electroluminesces at a peak wavelength of 404 and 367 nanometers respectively. The resulting emissions have CIE chromaticity coordinates which lie at the boundary of the visible range for the human eye thereby allowing a greater range of colors for full color flat panel electroluminescent displays.

U.S. Pat. No. 5,648,181 describes an inorganic thin film electroluminescent device, comprising an inorganic light emission layer, a pair of electrodes and a pair of insulating layers, at least one of the electrodes being optically transparent, the light emission layer being positioned between the pair of insulating layers, each insulating layer being formed on an opposite side of the light emission layer, the pair of insulating layers being positioned between a light emission layer and the pair of electrodes, the light emission layer consisting essentially of inorganic material comprising a matrix of lanthanum fluoride doped with at least one member selected from the group consisting of: rare earth element metals and compounds thereof.

U.S. Pat. No. 5,698,857 teaches a radiographic phosphor screen comprising a support and, coated on the support, at least one layer forming a luminescent portion and an overcoat layer, the luminescent portion and overcoat layer including a binder that is transparent to X-radiation and emitted light and said luminescent portion including phosphor particles in a weight ratio of phosphor particles to binder of 7:1 to 25:1. The phosphor comprises oxygen and a combination of species characterized by the relationship:

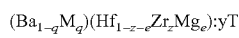

$(Ba_{1-q}M_q)(Hf_{1-z-e}Zr_zMg_e):yT$ wherein M is selected from the group consisting of Ca and Sr and combinations thereof; T is Cu; q is from 0 to 0.15; z is from 0 to 1; e is from 0 to 0.1; z+e is from 0 to 1; and y is from $1 \times 10^{-6}$ to 0.02.

U.S. Pat. No. 5,998,925 provides a light-emitting device, comprising a light emitting component and a phosphor capable of absorbing a part of light emitted by the light emitting component and emitting light of wavelength different from that of the absorbed light; wherein the light-emitting component comprises a nitride compound semiconductor represented by the formula: $In_i Ga_j Al_k N$ where 0<i, 0<j, 0<k and i+j+k=1 and the phosphor contains a garnet fluorescent material comprising: 1) at least one element selected from the group consisting of Y, Lu, Se, La, Gd and Sm; and 2) at least one element selected from the group consisting of Al, Ga and In, and being activated with cerium. One inorganic phosphor used in commercial white LEDs is the cerium-doped yttrium aluminum garnet $Y_3Al_5O_{12}$:Ce (YAG:Ce) and its derivative phosphors described in this patent, which is regarded by many in the field as being the standard inorganic phosphor used in commercial white LEDs as of this writing.

U.S. Pat. No. 6,006,582 sets forth a hydrogen sensor for the detection of hydrogen gas in a gaseous environment susceptible to the incursion or generation of hydrogen, said sensor comprising: (i) a rare earth metal thin film, consisting essentially of one or more metals selected from the group consisting of scandium, yttrium, lanthanum cerium, praseodymium, neodymium, promethium, samarium, europium, gadolinium, terbium, dysprosium, holmium, erbium, thulium, ytterbium, lutetium, actinium, thorium, protactinium, uranium, neptunium, plutonium, americium, curium, berkelium, californium, einsteinium, fermium, mendelevium, nobelium, lawrencium, and alloys thereof with one or more of magnesium, calcium, barium, strontium, cobalt and iridium, with the rare earth metal thin film exhibiting a detectable change of physical property when the rare earth metal thin film is exposed to hydrogen gas in a gaseous environment, wherein the rare earth metal thin film is arranged for exposure to the gaseous environment susceptible to the incursion or generation of hydrogen; and (ii) means for exhibiting the detectable change of physical property when the rare earth metal thin film is exposed to hydrogen in said gaseous environment, said means including circuitry for signal processing the change of physical property and generating an output indicative of hydrogen gas, and wherein the sensor does not comprise a source of hydrogen arranged for selectively switching the rare earth metal thin film between respective switched states.

U.S. Pat. No. 6,066,861 teaches a wavelength-converting casting composition, for converting a wavelength of ultraviolet, blue or green light emitted by an electroluminescent component, comprising: a) a transparent epoxy casting resin; b) an inorganic luminous substance pigment powder dispersed in the transparent epoxy resin, the pigment powder comprising luminous substance pigments from a phosphorus group having the general formula:

$A_3B_5X_{12}$:M, where A is an element selected from the group consisting of Y, Ca, Sr; B is an element selected from the group consisting of Al, Ga, Si; X is an element selected from the group consisting of O and S; and M is an element selected from the group consisting of Ce and Tb. The luminous substance pigments have grain sizes <20 μm and a mean grain diameter $d_{50}$<5 μm.

U.S. Pat. No. 6,153,971 describes a method for illuminating an object that allows categorical color perception of at least red, green, blue, yellow and white on the surface of the illuminated object, the method comprising: illuminating the object with light consisting essentially of the combination of light of two major wavelength bands, in which: the first wavelength band is from 530 to 580 nm; and the second wavelength band is from 600 to 650 nm.

U.S. Pat. No. 6,255,670 teaches a composition of matter comprising $Ba_2(Mg,Zn)Si_2O_7$:$Eu^{2+}$, as well as a composition of matter comprising: 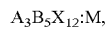 $(Ba_{1-X-Y-Z},Ca_X,Sr_Y,Eu_Z)_2 (Mg_{1-W},Zn_W)$ $Si_2O_7$, wherein X+Y+Z=1; Z>0; and 0.05<W<0.50.

BRIEF SUMMARY OF THE INVENTION

The present invention provides a thioselenide and/or selenide-based fluorescent material which is capable of absorbing with high efficiency blue, violet, or ultraviolet (UV) light emitted by a light source such as an LED or laser diode, and emitting light of a wavelength longer from that absorbed from the light source. The phosphor materials provided by the present invention can be manufactured to emit broad color spectra that can be tuned from blue to green to yellow and red emissions. By combining the appropriate material of the present invention with a blue or violet LED, it is also possible to produce white light using a single or multiple component phosphor system.

The phosphor component of a light-emitting device made using the phosphors provided by the present invention may be made using either a single phosphor component or a compatible mix of different phosphors derived from the above formula in order to achieve a specific, desired white color performance.

Thus, the present invention in one of its preferred forms provides a composition of matter useful as a phosphor in light emitting diodes, which comprises a material described by the formula:

$$MA_2(S_xSe_y)_4:B$$

in which in a preferred embodiment x and y are each independently any value between about 0.01 and about 1; M is at least one of Be, Mg, Ca, Sr, Ba, Zn; and A is at least one of Al, Ga, In, Y, La, and Gd; and the activator B is at least one of Eu, Ce, Cu, Ag, Al, Tb, Cl, F, Br, I, Pr, Na, K, Mg, and Mn. According to one form of the invention, divalent Eu, which can serve as the main activator, is present in any amount between 0.0001% and about 10% in mole percent based on the total molar weight of said composition. Thus, the activator, Eu, may be present in any amount between 0.0001% and 10.00% in mole percent based on the total molar weight of the composition, including every thousandth percentage therebetween. According to an alternative form of the invention, $0.5 \leq x \leq 1$ and $0 \leq y \leq 0.5$ in the above formula. According to another alternative form of the invention, $0 \leq x \leq 0.5$ and $0 \leq y \leq 0.5$ in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula. According to another alternative form of the invention, x is about 0 and y is about 1 in the above formula. According to another alternative form of the invention, x is about 1 and y is about 0 in the above formula.

Another embodiment of the present invention in one of its preferred forms provides a composition of matter useful as a phosphor in light emitting diodes, which comprises a material described by the formula:

$$MA_2(S_xSe_y)_4:B$$

in which x and y are each independently any value between about 0.01 and about 1, M is at least one of Be, Mg, Ca, Sr, Ba, Zn; and A is at least one of Al, Ga, In, Y, La, and Gd; and the activator B is at least one of Eu, Ce, Cu, Ag, Al, Tb, Cl, F, Br, I, Pr, K, Na, Mg, and Mn. According to one form of the invention, trivalent Ce, which can serve as the main activator, is present in any amount between 0.0001% and about 10% in mole percent based on the total molar weight of said composition. Thus, the activator, Ce, may be present in any amount between 0.0001% and 10.00% in mole percent based on the total molar weight of the composition, including every thousandth percentage there between. According to an alternative form of the invention, $0.5 \leq x \leq 1$ and $0 \leq y \leq 0.5$ in the above formula. According to another alternative form of the invention, $0 \leq x \leq 0.5$ and $0 \leq y \leq 0.5$ in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula. According to another alternative form of the invention, x is about 0 and y is about 1 in the above formula. According to another alternative form of the invention, x is about 1 and y is about 0 in the above formula.

Another embodiment of the present invention in one of its preferred forms provides a composition of matter useful as a phosphor in light emitting diodes, which comprises a material described by the formula:

$$M_2A_4(S_xSe_y)_7:B$$

in which x and y are each independently any value between about 0.01 and about 1, M is at least one of Be, Mg, Ca, Sr, Ba, Zn; and A is at least one of Al, Ga, In, Y, La, and Gd; and B is at least one of Eu, Ce, Cu, Ag, Al, Tb, Cl, Br, F, I, Pr, K, Na, Mg, and Mn. According to one form of the invention, divalent Eu, which can serve as the main activator, is present in any amount between 0.0001% and about 10% in mole percent based on the total molar weight of said composition. Thus, the activator, Eu, may be present in any amount between 0.0001% and 10.00% in mole percent based on the total molar weight of the composition, including every thousandth percentage there between. According to an alternative form of the invention, $0.5 \leq x \leq 1$ and $0 \leq y \leq 0.5$ in the above formula. According to another alternative form of the invention, $0 \leq x \leq 0.5$ and $0 \leq y \leq 0.5$ in the above formula. According to another alternative form of the invention, x is about 1 and y is about 0 in the above formula. According to another alternative form of the invention, x is about 0 and y=1 in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula.

Another embodiment of the present invention in one of its preferred forms provides a composition of matter useful as a phosphor in light emitting diodes, which comprises a material described by the formula:

$$M_2A_4(S_xSe_y)_7:B$$

in which x and y are each independently any value between about 0.01 and about 1, M is at least one of Be, Mg, Ca, Sr, Ba, Zn; and A is at least one of Al, Ga, In, Y, La, and Gd; and B is at least one of Eu, Ce, Cu, Ag, Al, Tb, Cl, Br, F, I, Pr, K, Na, Mg, and Mn. According to one form of the invention, trivalent Ce, which can serve as the main activator, is present in any amount between 0.0001% and about 10% in mole percent based on the total molar weight of said composition. Thus, the activator, Ce, may be present in any amount between 0.0001% and 10.00% in mole percent based on the total molar weight of the composition, including every thousandth percentage there between. According to an alternative form of the invention, $0.5 \leq x \leq 1$ and $0 \leq y \leq 0.5$ in the above formula. According to another alternative form of the invention, $0 \leq x \leq 0.5$ and $0.5 \leq y \leq 1.0$ in the above formula. According to another alternative form of the invention, $0 \leq x \leq 0.5$ and $0 \leq y \leq 0.5$ in the above formula. According to another alternative form of the invention, x is about 1 and y is about 0 in the above formula. According to another alternative form of the invention, x is about 0 and y is about 1 in the above formula. According to another alternative form of the invention, x is about 0.75 and y is about 0.25 in the above formula.

The invention also provides a composition of matter useful as a phosphor material in light emitting diodes, which composition comprises a material described by the formula:

$$MA_2(S_xSe_y)_4:B$$

in which x, and y are each independently any value between 0 and about 1, including 0 and 1; M is at least one of Be, Mg, Ca, Sr, Ba, Zn; and A is at least one of Al, Ga, In, Y, La, and Gd; and wherein the activator(s) B is a mixture which comprises more than one element selected from the group consisting of: Eu, Ce, Cu, Ag, Al, Tb, Cl, Br, F, I, Pr, K, Na, Mg, and Mn, including those mixtures which comprise any two, any three, any four, any five, any six, any seven, or more of these elements in any proportion, and wherein the elements in these mixtures may each independently be present in any amount between 0.0001% and about 5% in mole percent based on the total molar weight of said composition. Thus, the elements comprising the activator(s), B, may each be present independently in any amount between 0.0001% and 5.00% in mole percent, based on the total molar weight of the composition, including every thousandth percentage therebetween. According to an alternative form of the invention, $0.5 \leq x \leq 1.0$ and $0 \leq y \leq 0.5$ in the above formula with mixtures of said activator(s) present. According to another alternative form of the invention, x is about 1 and y is about 0 in the above formula with mixtures of said activator(s) present. According to another alternative form of the invention, $0 \leq x \leq 0.5$ and $0 \leq y \leq 0.5$ in the above formula with mixtures of said activator(s) present. According to another alternative form of the invention, x is about 0 and y is about 1 in the above formula with mixtures of said activator(s) present. According to another alternative form of the invention, $0 \leq x \leq 0.5$ and $0.5 \leq y \leq 1.0$ in the above formula with mixtures of said activator(s) present. According to another alternative form of the invention, x is about 0.75 and is about 0.25 in the above formula with mixtures of activators present.

The invention also provides a light emitting device comprising a light source selected from the group consisting of: light-emitting diodes and lasers, wherein the light source emits light having a wavelength of between 360 and 480 nanometers; and a phosphor composition described by any one or more of the foregoing formulae, including the defining set of constraints specified for each one, including without limitation those described by formula:

$$MA_2(S_xSe_y)_4{:}B$$

in which x and y are each independently any value between 0 and about 1, including 0 and 1, M is at least one of Be, Mg, Ca, Sr, Ba, Zn; and A is at least one of Al, Ga, In, Y, La, and Gd; and wherein the activator(s) B, comprises one or more elements selected from the group consisting of: Eu, Ce, Cu, Ag, Al, Tb, Cl, Br, F, Na, K, Pr, I, Mg, and Mn, including those mixtures which comprise any two, any three, any four, any five, any six, any seven, or more of these elements in any proportion, and wherein the elements in these mixtures may each independently be present in any amount between 0.0001% and about 10% in mole percent based on the total molar weight of said composition, and wherein the phosphor is disposed in a location at which it receives light from said light source. According to one form of the invention, the total amount of such activator(s) are present in the phosphor of such light emitting device in any amount between 0.0001% and 10.00% in mole percent based upon the total molar weight of the phosphor.

The invention also provides a light emitting device comprising a light source selected from the group consisting of: light-emitting diodes and lasers, wherein the light source emits light having a wavelength of between 360 and 480 nanometers; and a phosphor composition described by any one or more of the foregoing formulae, including the defining set of constraints specified for each one, including without limitation those described by formula:

$$MA_4(S_xSe_y)_7{:}B$$

in which x and y are each independently any value between 0 and about 1, including 0 and 1, M is at least one of Be, Mg, Ca, Sr, Ba, Zn; and A is at least one of Al, Ga, In, Y, La, and Gd; and wherein the activator(s) B, comprises one or more element selected from the group consisting of: Eu, Ce, Cu, Ag, Al, Tb, Cl, Br, F, I, Pr, K, Na, Mg, and Mn, including those mixtures which comprise any two, any three, any four, any five, any six, any seven, or more of these elements in any proportion, and wherein the elements in these mixtures may each independently be present in any amount between 0.0001% and about 10% in mole percent based on the total molar weight of said composition, and wherein the phosphor is disposed in a location at which it receives light from said light source. According to one form of the invention, the total amount of such activator(s) are present in the phosphor of such light emitting device in any amount between 0.0001% and 10.00% in mole percent based upon the total molar weight of the phosphor.

The invention also provides compositions of matter useful as a phosphor in light emitting diodes, which comprises a material described by the formula:

$$(M1)_m(M2)_nA_2(S_xSe_y)_4{:}B$$

in which:
M1 comprises an element selected from the group consisting of: Be, Mg, Ca, Sr, Ba, Zn;
M2 comprises an element selected from the group consisting of: Be, Mg, Ca, Sr, Ba, Zn;
A comprises one or more elements selected from the group consisting of: Al, Ga, In, Y, La, and Gd;
B comprises one or more elements selected from the group consisting of: Eu, Ce, Cu, Ag, Al, Tb, Cl, Br, F, I, Mg, Pr, K, Na, and Mn, wherein B is present in any amount between 0.0001% and about 10% in mole percent based on the total molar weight of said composition, and wherein x and y are each independently any value between 0 and 1, subject to the provisos that the sum of x and y is equal to any number in the range of between about 0.75 and about 1.25, the sum of m and n is about 1, and M1 is different than M2. According to an alternative form of the invention, $0.5 \leq x \leq 1$ and $0 \leq y \leq 0.5$ in the above formula. According to another alternative form of the invention, $0 \leq x \leq 0.5$ and $0 \leq y \leq 0.5$ in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula. According to another alternative form of the invention, x is about 0 and y is about 1 in the above formula. According to another alternative form of the invention, x is about 1 and y is about 0 in the above formula.

In an alternate embodiment, the invention provides a composition of matter useful as a phosphor in light emitting diodes, which comprises a material described by the formula:

$$(M1)_m(M2)_nA_4(S_xSe_y)_7{:}B$$

in which:
M1 comprises an element selected from the group consisting of: Be, Mg, Ca, Sr, Ba, Zn;
M2 comprises an element selected from the group consisting of: Be, Mg, Ca, Sr, Ba, Zn;
A comprises one or more elements selected from the group consisting of: Al, Ga, In, Y, La, and Gd;

B comprises one or more elements selected from the group consisting of: Eu, Ce, Cu, Ag, Al, Th, Cl, Br, F, I, Mg, Pr, K, Na, and Mn, wherein B is present in any amount between 0.0001% and about 10% in mole percent based on the total molar weight of said composition, and wherein x and y are each independently any value between 0 and 1, subject to the provisos that the sum of x and y is equal to any number in the range of between about 0.75 and about 1.25, the sum of m and n is about 2, and M1 is different than M2. According to an alternative form of the invention, $0.5 \leq x \leq 1$ and $0 \leq y \leq 0.5$ in the above formula. According to another alternative form of the invention, $0 \leq x \leq 0.5$ and $0 \leq y \leq 0.5$ in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula. According to another alternative form of the invention, x is about 0 and y is about 1 in the above formula. According to another alternative form of the invention, x is about 1 and y is about 0 in the above formula.

The invention also provides light emitting devices which comprises a phosphor that is a single phosphor according to the invention, as well as light emitting devices which comprise a mixture of two or more different phosphors provided by the invention, and light emitting devices which comprise one or more phosphors provided by the invention mixed with a phosphor of the prior art. In one embodiment, the phosphor mixture causes the light-emitting device to emit white light. In another embodiment, a single phosphor according to the present invention causes a blue light-emitting device to emit white light.

DETAILED DESCRIPTION

Figure 1:
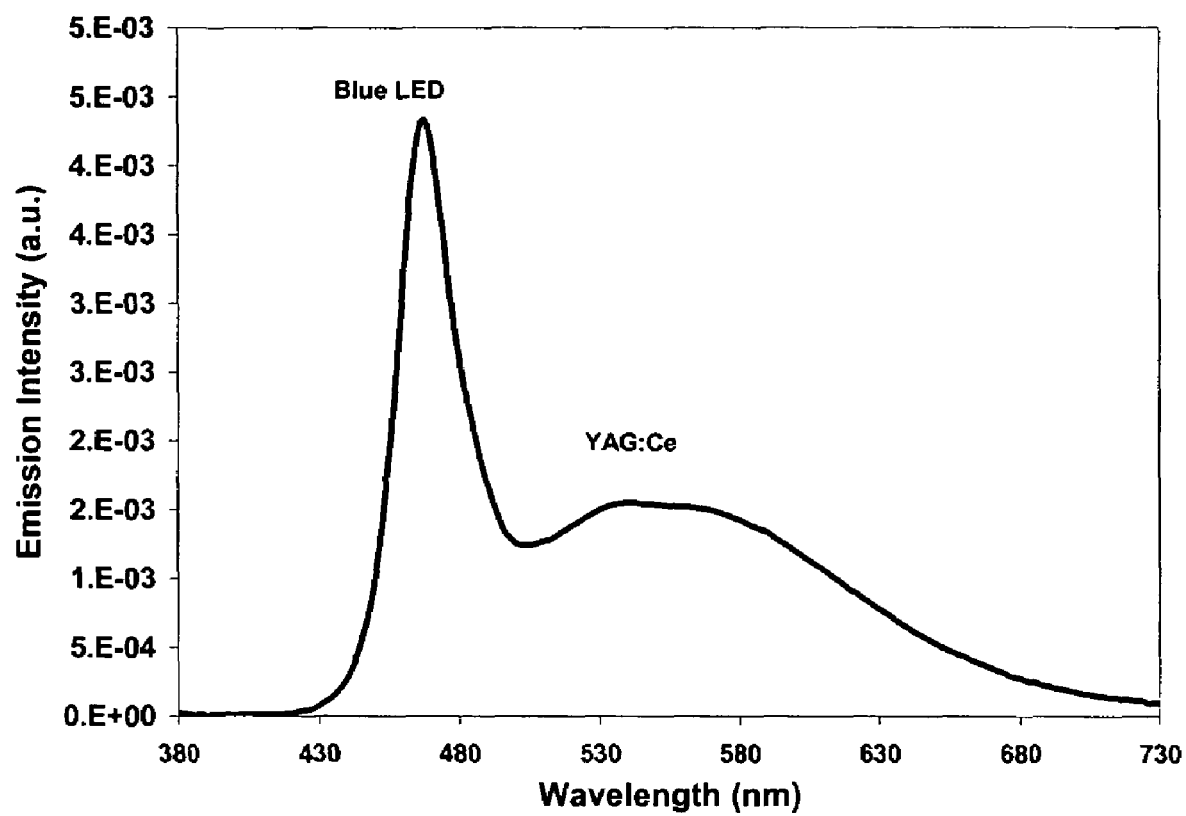
FIG. 1 shows the spectrum of light emitted by a prior art YAG:Ce phosphor.

Referring to the drawings and initially to FIG. 1, there is shown an illustration of the spectrum of light emitted when conventional prior art YAG:Ce phosphors pumped by a blue LED to produce white light. In addition to the YAG:Ce, several types of organic-based fluorescent materials have also been employed, but organic molecules are susceptible to deterioration and accelerated aging when exposed to intense UV or blue light and the high temperatures present near the LED surface. However, with the exception of the YAG:Ce phosphor and its derivatives, there are very few inorganic materials that can efficiently convert blue or violet light to white while maintaining long-term stability. Furthermore, the standard YAG:Ce phosphor used in blue LEDs is deficient in both the blue green and red parts of the spectrum, resulting in low luminous efficiency and color rendering properties.

One of the advantages of using a blue LED with a single-component yellow phosphor instead of a UV LED and an RGB phosphor mix is a more stable color output over time since the latter approach suffers from differential phosphor aging due to the high temperature and light intensity near the LED surface.

Figure 2:
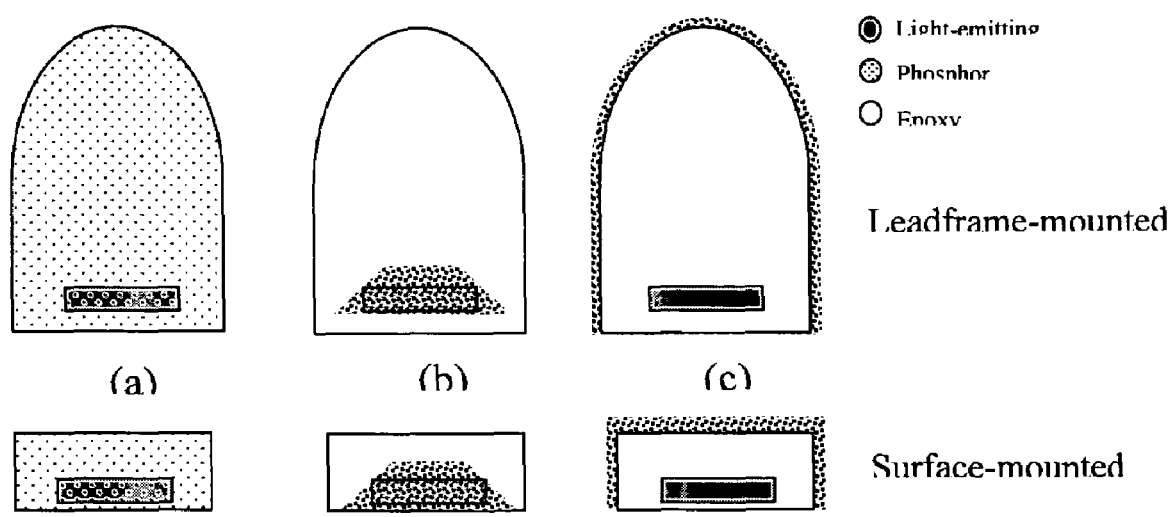
FIG. 2 illustrates some of the known configurations employed to couple the phosphor particles to an LED.

FIGS. 2A, 2B, and 2C illustrate some of the possible configurations used to couple the phosphor particles to an LED, where the phosphor can be either dispersed throughout an epoxy (FIG. 2A) as such dispersion and techniques for its production is known to those skilled in the art, or dispensed directly on the LED light emitting area (FIG. 2B), or on the outside surface of the epoxy (FIG. 2C). The epoxy may encapsulate the LED. The standard commercial technique used in phosphor deposition on LED dies involves blending the phosphor powders in optically clear liquid polymer systems, such as polypropylene, polycarbonate, or polytetrafluoroethylene (PTFE), or, more commonly, epoxy resins, or silicone, as is known to those skilled in the art. The resulting material is subsequently painted or otherwise dispensed on the LED and dried, solidified, or cured. A final layer of epoxy is often subsequently applied to protect the entire assembly or to in some cases act as an optical lens for the purpose of focusing the light emitted from the LED die. Thus, the phosphors provided by the invention are well-suited to being processed and deposited onto substrates using conventional techniques known in the art for producing light emitting devices, such as light emitting diodes.

One embodiment of the present invention provides a light emitting device comprising a UV/blue light emitting diode and one or more phosphors which absorb all or part of the light emitted by the light emitting diode, and which emit light of wavelengths longer from that of the absorbed light. A phosphor composition provided by the invention which is useful in such regard is described by the formula:

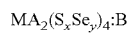

$$MA_2(S_xSe_y)_4:B$$

in which x and y are each independently any value between about 0 and about 1, including 0 and 1, including without limitation 0.001 and 1, and every thousandth therebetween; M is one or more of Be, Mg, Ca, Sr, Ba, Zn; and A is one or more of Al, Ga, In, Y, La, and Gd; and wherein the activator B comprises one element(s) selected from the group consisting of: Eu, Ce, Cu, Ag, Al, Tb, Cl, Br, F, I, Mg, Pr, K, Na, and Mn; wherein such element(s) may be present in any amount between 0.0001% and about 10% in mole percent based on the total molar weight of said composition. In one embodiment, the sum of x and y is equal to any number between about 0.500 and about 1.500. According to another embodiment, the sum of x and y is equal to any number between about 0.750 and about 1.250. According to a preferred form of the invention, B is present as Eu in any amount between about 0.0001% and about 10% by weight based upon the phosphor's total weight. According to another preferred form of the invention, B is present as Ce in any amount between about 0.0001% and about 10% by weight based upon the phosphor's total weight. According to an alternative form of the invention, $0.5 \leq x \leq 1$ and $0 \leq y \leq 0.5$ in the above formula. According to another alternative form of the invention, x is about 0 and y is about 1 in the above formula. According to another alternative form of the invention, $0 \leq x \leq 0.5$ and $0 \leq y \leq 0.5$ in the above formula. According to another alternative form of the invention, x is about 1 and y is about 0 in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula.

In yet another preferred form of the invention is provided a phosphor composition as described by the formula:

$$MA_2(S_xSe_y)_4{:}B$$

in which x and y are each independently any value between about 0 and about 1, including without limitation 0.001 and 1, and every thousandth therebetween, and M is one or more of Be, Mg, Ca, Sr, Ba, Zn; A is one or more of Al, Ga, In, Y, La, and Gd; and wherein the activator(s), B is a mixture which comprises more than one element selected from the group consisting of: Eu, Ce, Cu, Ag, Al, Tb, Cl, Br, F, I, Mg, Pr, Na, K, and Mn, including those mixtures comprising any two, any three, any four, any five, any six, any seven, or more of these elements with each present in any proportion, and wherein the elements in these mixtures may each independently be present in any amount between 0.0001% and about 10% in mole percent based on the total molar weight of said composition. In one embodiment, the sum of x and y is equal to any number between about 0.500 and about 1.500. According to another embodiment, the sum of x and y is equal to any number between about 0.750 and about 1.250. According to a preferred form of the invention, activator B is present as Eu in any amount between about 0.0001% and about 10% by weight based upon the phosphor's total weight. Also, one or more additional activators selected from the group consisting of Ce, Cu, Ag, Al, Tb, Cl, Br, F, I, Mg, Pr, K, Na, and Mn may be present, including mixtures of any two or more of these elements, each present in any proportion, and which additional activators are present independently of the amounts of other constituents of said composition in any amount between about 0.0001% and about 10% by weight based on the phosphor's total weight. According to one alternative form of the invention, $0.5 \leq x \leq 1$ and $0 \leq y \leq 0.5$ in the above formula. According to another alternative form of the invention, x is about 1 and y is about 0 in the above formula. According to another alternative form of the invention, $0 \leq x \leq 0.5$ and $0 \leq y \leq 0.5$ in the above formula. According to another alternative form of the invention, x is about 0 and y is about 1 in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula. According to a preferred form of the invention, activator B is present as Ce in any amount between about 0.0001% and about 10% by weight based upon the phosphor's total weight. Also, one or more additional activators selected from the group consisting of Ce, Cu, Ag, Al, Tb, Cl, Br, F, I, Mg, Pr, K, Na, and Mn may be present, including mixtures of any two or more of these elements, each present in any proportion, and which additional activators are present independently of the amounts of other constituents of said composition in any amount between about 0.0001% and about 10% by weight based on the phosphor's total weight. According to one alternative form of the invention, $0.5 \leq x \leq 1$ and $0 \leq y \leq 0.5$ in the above formula. According to another alternative form of the invention, x=is about 1 and y is about 0 in the above formula. According to another alternative form of the invention, $0 \leq x \leq 0.5$ and $0 \leq y \leq 0.5$ in the above formula. According to another alternative form of the invention, x is about 0 and y is about 1 in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula.

One embodiment of the present invention provides a light emitting device comprising a UV/blue light emitting diode and one or more phosphors which absorb all or part of the light emitted by the light emitting diode, and which emit light of wavelengths longer from that of the absorbed light. A phosphor provided by the invention which is useful in such regard is described by the formula:

$$MA_4(S_xSe_y)_7{:}B$$

in which x and y are each independently any value between about 0 and about 1, including 0 and 1, including without limitation 0.001 and 1, and every thousandth therebetween; M is one or more of Be, Mg, Ca, Sr, Ba, Zn; and A is one or more of Al, Ga, In, Y, La, and Gd; and wherein the activator B comprises one or more element(s) selected from the group consisting of: Eu, Ce, Cu, Ag, Al, Tb, Cl, Br, F, I, Mg, Pr, K, Na, and Mn; wherein this element or elements may be present in any total amount between about 0.0001% and about 10% in mole percent based on the total molar weight of the composition. In one embodiment, the sum of x and y is equal to any number between about 0.500 and about 1.500. According to another embodiment, the sum of x and y is equal to any number between about 0.750 and about 1.250. According to a preferred form of the invention B is present as Eu independently in any amount between about 0.0001% and about 10% by weight based upon the phosphor's total weight. According to another preferred form of the invention, B is present as Ce independently in any amount between about 0.0001% and about 10% by weight based upon the phosphor's total weight. According to an alternative form of the invention $0.5 \leq x \leq 1$ and $0 \leq y \leq 0.5$ in the above formula. According to another alternative form of the invention, x is about 0 and y is about 1 in the above formula. According to another alternative form of the invention, $0 \leq x \leq 0.5$ and $0 \leq y \leq 0.5$ in the above formula. According to another alternative form of the invention, x is about 1 and y is about 0 in the above formula. According to another alternative form of the invention, $0 \leq x \leq 0.5$ and $0.5 \leq y \leq 0.0$ in the above formula. According to another alternative form of the invention, x is about 0.75 and y is about 0.25 in the above formula.

In another preferred form of the invention is provided a phosphor as described by the formula $$MA_4(S_xSe_y)_7{:}B$$

in which x and y are each independently any value between about 0 and about 1, including without limitation 0.001 and 1, and every thousandth therebetween, and M is at least one of Be, Mg, Ca, Sr, Ba, Zn; A is at least one of Al, Ga, In, Y, La, and Gd; and wherein the activator(s) B comprises more than one element selected from the group consisting of: Eu, Ce, Cu, Ag, Al, Tb, Cl, Br, F, I, Mg, Pr, Na, K, and Mn, including mixtures comprising any two, any three, any four, any five, any six, any seven, or more of these elements independently in any proportion, and wherein the elements in these mixtures may each independently be present in any amount between about 0.0001% and about 10% in mole percent based on the total molar weight of said composition. In one embodiment, the sum of x and y is equal to any number between about 0.500 and about 1.500. According to another embodiment, the sum of x and y is equal to any number between about 0.750 and about 1.250. According to a preferred form of the invention, activator B is present as Eu in any amount between about 0.0001% and about 10% by weight based upon the phosphor's total weight. Also, one or more additional activators selected from the group consisting of Ce, Cu, Ag, Al, Tb, Cl, Br, F, I, Mg, Pr, Na, K, and Mn may be present, including any mixture including any two or more of the foregoing, in any proportion, and which additional activators are present independently of the amounts of other constituents of said composition in any amount between about 0.0001% and about 10% by weight based on the phosphor's total weight. According to one alternative form of the invention, $0.5 \leq x \leq 1$ and $0 \leq y \leq 0.5$ in the above formula. According to another alternative form of the invention, x is about 1 and y is about 0 in the above formula. According to another alternative form of the invention, $0 \leq x \leq 0.5$ and $0 \leq y \leq 0.5$ in the above formula. According to another alternative form of the invention, x is about 0 and y is about 1 in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula. According to a preferred form of the invention, activator B is present as Ce in any amount between about 0.0001% and about 10% by weight based upon the phosphor's total weight. Also, one or more additional activators selected from the group consisting of Ce, Cu, Ag, Al, Tb, Cl, Br, F, I, Mg, Pr, Na, K, and Mn may be present, including mixtures of any two or more of the foregoing, in any proportion, and which additional activators are present independently of the amounts of other constituents of said composition in any amount between about 0.0001% and about 10% by weight based on the phosphor's total weight. According to one alternative form of the invention, $0.5 \leq x \leq 1$ and $0 \leq y \leq 0.5$ in the above formula. According to another alternative form of the invention, x=1 and y is about 0 in the above formula. According to another alternative form of the invention, $0 \leq x \leq 0.5$ and $0 \leq y \leq 0.5$ in the above formula. According to another alternative form of the invention, x is about 0 and y is about 1 in the above formula. According to another alternative form of the invention, $0 \leq x \leq 0.5$ and $0.5 \leq y \leq 1.0$ in the above formula. According to another alternative form of the invention, x is about 0.75 and y is about 0.25 in the above formula.

Synthesis of the Phosphors

The phosphor materials provided by the present invention are preferably synthesized using powdered metal sulfides MS and $A_2S_3$ and selenium Se as the starting materials, where M is at least one of Be, Mg, Ca, Sr, Ba, Zn and A is at least one of Al, Ga, In, Y, La, and Gd. After thoroughly mixing the raw materials in the desired molar ratio, a compound containing one or more of the desired other elements selected to be present in the final composition, which are sometimes referred to as "activating element(s)" or "activator(s)" by those skilled in the art, are slurried into the raw material mixture using distilled or de-ionized water and/or a solvent such as isopropyl alcohol, methanol, ethanol, etc. as the slurry vehicle. Activating elements useful to provide a composition according to the present invention include the elements europium, cerium, copper, silver, aluminum, terbium, chlorine, iodine, magnesium, praseodymium, sodium, potassium, and manganese, and to provide such elements in a final phosphor according to the invention, it is preferable to employ compounds or salts of Eu, Ce, Cu, Ag, Al, Tb, Cl, Br, F, I, Mg, Pr, K, Na, and Mn such as by use of halides (including Cl, Br, I, F) of metallic elements, or sulfides, oxides, or carbonates, or other raw materials which provide the activator element(s) to be present in the final composition. Additionally, it is preferable to add one or more flux materials ($NH_4Cl$, $ZnCl_2$, etc.) to enhance the reaction between the host material, which according to one preferred form of the present invention is $MA_2(S_xSe_y)_4$ with attendant constraints and features as elsewhere set forth herein, as the use of such fluxes are known to those skilled in the art. After a thorough mechanical mixing using conventional means such as a mortar and pestle, ball mill, grinder, etc., the resulting material is fired at a temperature which is preferably in the range of about 700° C. to about 1200° C. in vacuum, inert, or reducing atmosphere, to create a $MA_2(S_xSe_y)_4$:B compound, which may be luminescent. The material resulting from such firing is subsequently cooled, and then cocomminutated before an optional second firing stage at a temperature in the range of about 700° C. to about 1200° C. in vacuum, inert atmosphere, such as in nitrogen or argon, or a reducing atmosphere such as $N_2/H_2$, CO, or $H_2S$ to achieve activation. Close control of the purity of the raw materials and preparation procedures are required to obtain phase purity in these phosphors, as is known in the art. The relative amounts of M, A, S, and Se present in the final product are readily adjustable by one of ordinary skill by adjusting the relative amounts of the raw materials which contain these elements in the raw material mixture.

The manufacturing process is not limited to the one previously described, but different starting materials and synthesis techniques can be used to achieve the same results and compounds. For example, the present invention contemplates the use of a host material such as $MA_2(S_xSe_y)_4$ compound as raw starting materials, which can be fired with appropriate activators in a controlled hydrogen sulfide and/or a hydrogen selenide atmosphere. The following examples are illustrative of preferred raw material mixtures, and should not be considered as delimitive of methods by which the compositions of the present invention may be prepared.

EXAMPLE 1

SrS 7.62 g
$Ga_2S_3$ 15 g
Se 10 g
$Eu_2O_3$ 0.56 g

The resulting composition has the formula $SrGa_2(S_{0.67}Se_{0.33})_4$:Eu(5%)

EXAMPLE 2

SrS 7.62 g
$Ga_2S_3$ 15 g
Se 13.5 g
$Eu_2O_3$ 0.56 g

The resulting composition has the formula $SrGa_2(S_{0.60}Se_{0.40})_4$:Eu(5%).

A phosphor according to the invention may be produced using mixtures of the ingredients specified in either of examples 1 or 2 above, by combining, slurry-mixing, and subsequently ball-milling in de-ionized water and/or solvent to an average particle size of about one to ten microns. After drying, the mixture is ball-milled or grinded into fine particles and then fired in a quartz crucible at 850° centigrade for 2 hours in an inert or reducing atmosphere. The luminescent material is then removed from the crucible and sifted in a sieve shaker in order to obtain phosphors with the particle size distribution desired.

In one preferred embodiment of the invention the present invention provides a green-yellow phosphor comprising the formula $SrGa_2(S_xSe_y)_4$:Eu in which x is about 0.67; y is about 0.33. The performance of this phosphor is shown in FIG. 3 which illustrates how one composition of the present invention can be used to efficiently convert part of the emission from a blue LED at 470 nm to yellow-green light around 540 nm.

Figure 4:
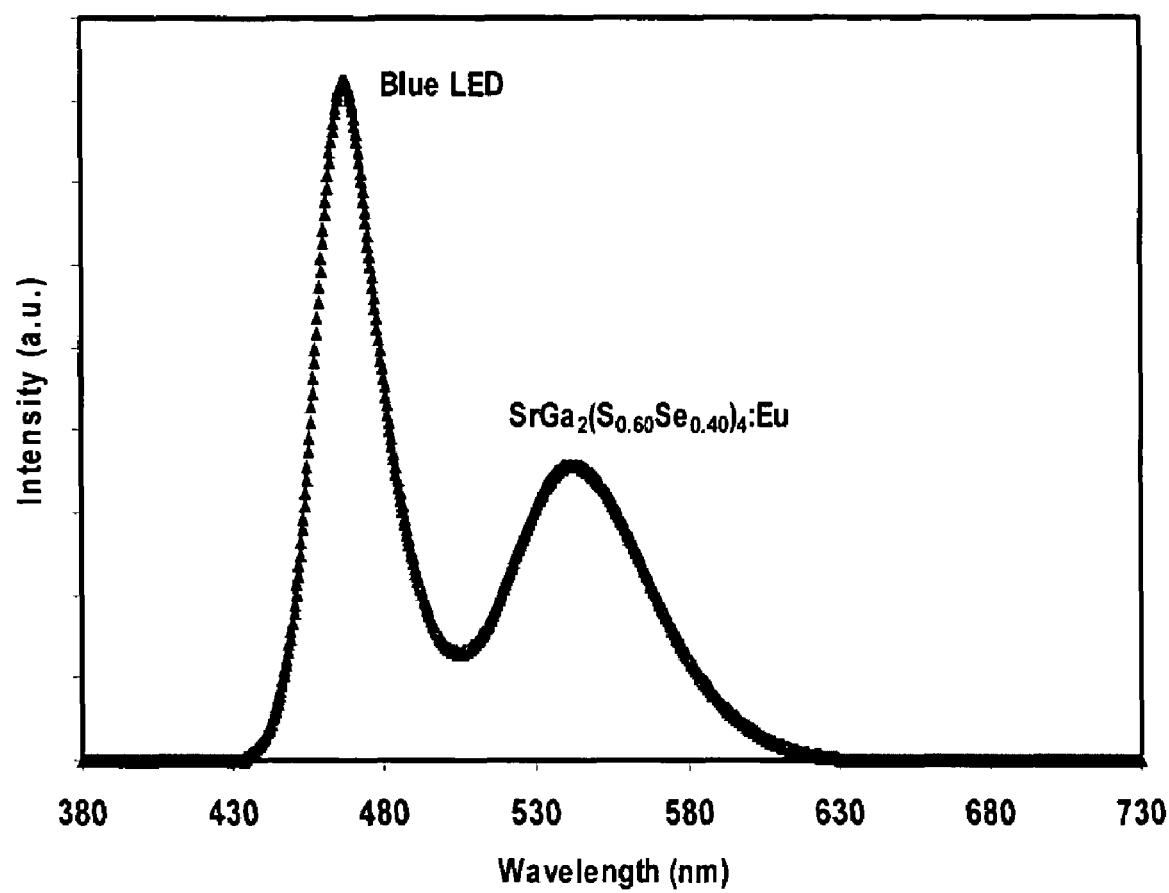
FIG. 4 illustrates the emission spectrum of a different composition of the thio-sulfoselenide phosphor excited by a blue LED.

FIG. 4 illustrates the spectrum displayed by another composition of the present invention, where the peak wavelength is shifter to longer wavelengths and the emission spectrum is broadened. $SrGa_2(S_xSe_y)_4$:Eu in which x is about 0.60; y is about 0.40 that efficiently converts the emission from a blue LED at 470 nm to green-yellow light around 541 nm.

Figure 3:
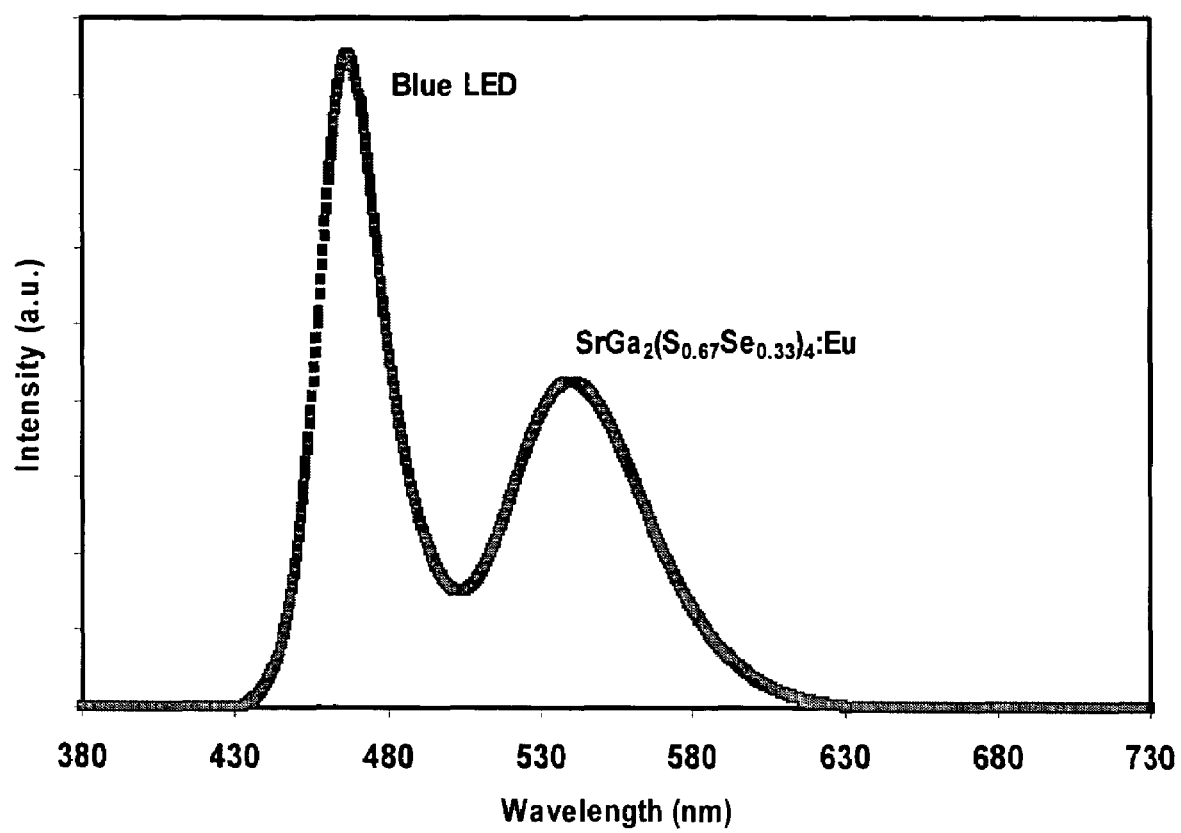
FIG. 3 illustrates the spectrum of one of the novel thio-selenide phosphor phases excited by a blue LED.
Figure 5:
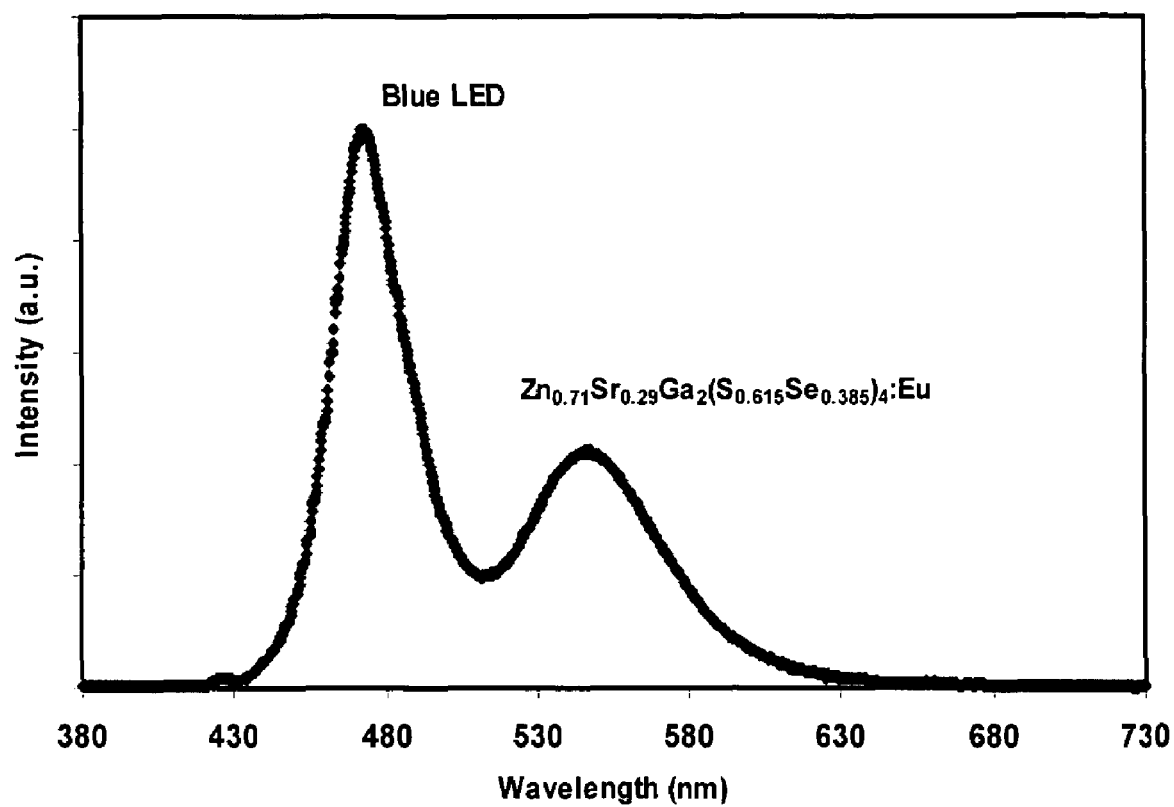
FIG. 5 illustrates the emission spectrum of a ZnSrGa$_2$(S$_x$Se$_y$)$_4$:Eu phosphor excited by a blue LED.
Figure 6:
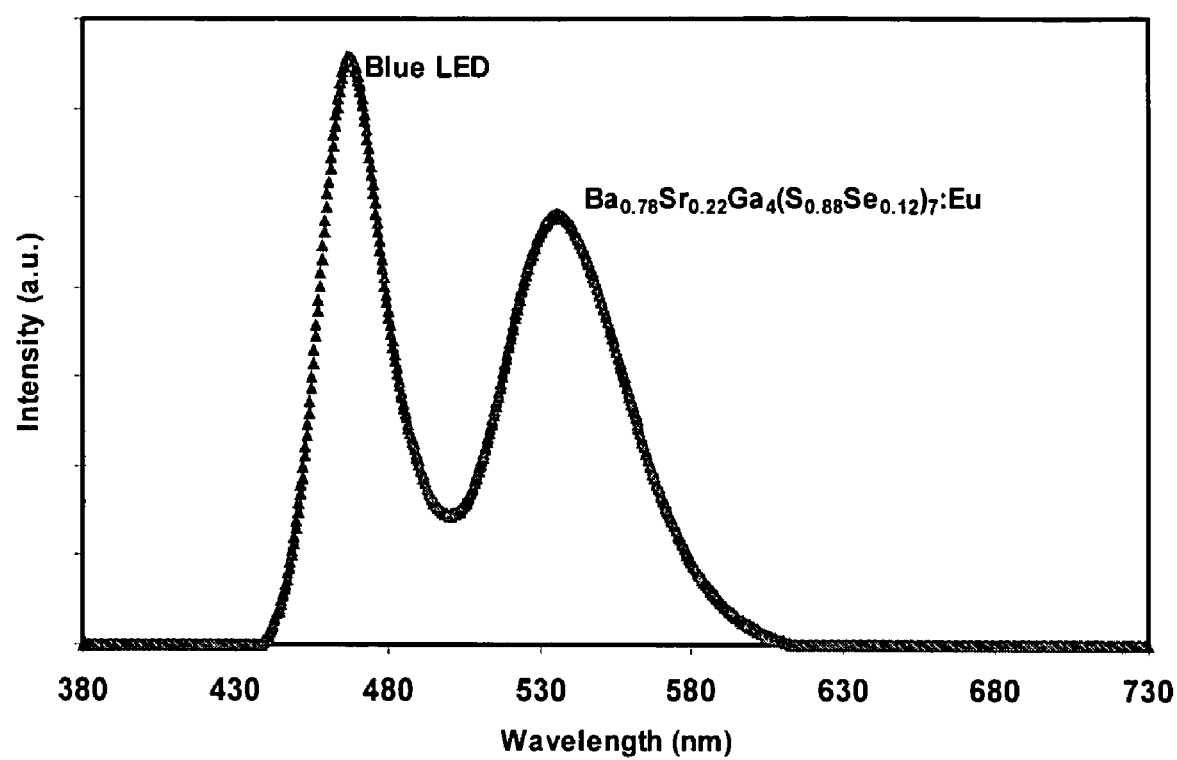
FIG. 6 illustrates the emission spectrum of a BaSrGa$_4$(SSe)$_7$:Eu phosphor excited by a blue LED.

In another preferred embodiment, the present invention provides a luminescent phosphor based on $Zn_uSr_vGa_2(S_xSe_y)_4$:Eu in which x is about 0.615; y is about 0.385 and u=0.71; v=0.29, based upon starting materials quantities, which has an emission peak around 548 nm and a broadened spectrum, with approximately an 11 nm larger full width at half of the maximum absorption ("FWHM"), compared to those shown in FIG. 3. and FIG. 4. The spectrum of this phosphor excited by a blue LED is shown in FIG. 5. In another preferred embodiment the present invention provides a luminescent phosphor based on $Ba_uSr_vGa_4(S_xSe_y)_7$:Eu in which x is about 0.88; y is about 0.12 and u=0.78; v=0.22. The spectrum of this phosphor excited by a blue LED is shown in FIG. 6. These phosphors are exemplary of the present invention, and shall not be construed as being delimitive of the scope of the present invention.

Thus, the present invention is broad with respect to the numerous possible compositions it affords one desiring of providing a phosphor, and the particular composition chosen by one practicing the invention will depend upon the particular requirements of the needs at hand. As can be seen in FIG. 5, adjusting the Se content as well as the composition of M creates a red shift in the emission spectrum as well as a broadening of the spectrum. This control of the components of the phosphor also makes it possible to shift the excitation spectrum of the phosphor from the ultraviolet to the blue region. Hence, the present invention is versatile in the number of phosphors possible within its scope.

Throughout this specification and the claims appended hereto, ranges are provided in relation to certain variables used to describe relative amounts of elemental constituents present in a composition of the invention in the format of: $0 \leq x \leq 1$. Such format is written with the intent that the reader of this specification and the claims appended hereto shall interpret such a range as including all numerical values between zero and one. As examples, given for the sole purpose of clarity and avoidance of doubt as to the breadth and scope of the meaning of this range within this specification and its claims, the range $0 \leq x \leq 1$ includes, without limitation, the numerical values represented by 0.000001, 0.067, ½, ⅙, 0.3333, 0.75, ⅔, 0.41666666, 0.9999999, 0.99, $^{100}/_{101}$, π/4, 0.74, 0.73999, 0.7400009, 0.1, 0.2, 0.3, 0.4, 0.5, 0.6, 0.7, 0.8, 0.9, 1, about 0.50001, as well as all ranges encompassed by the selection of any two numerical values, each of which individually have a value between 0 and 1. Thus, the expression $0 \leq x \leq 1$ inherently includes such ranges as $0 \leq x \leq 0.1$ and $0.001 \leq x \leq 0.79004217$. In cases of ranges which might come to mind such as $0.001 \leq x \leq 0.79004217$ where the number of significant figures at one end of the ranges is less than the number of significant figures at the other end of the range, the reader is hereby instructed to add an appropriate number of zeros as placeholders to compensate for any discrepancy perceived as blocking their interpretation of mathematical values.

The phrase: "present in any amount between about 0.0001% and about 10% in mole percent based on the total molar weight of said composition" frequently occurs in the present specification and the claims appended hereto. Substitution of this foregoing phrase with "present in any amount between about 0.0001% and about 10% in weight percent based upon the total weight of said composition (or phosphor, as the case may be)" in every occurrence provides further alternative embodiments of the invention.

Consideration must be given to the fact that although this invention has been described and disclosed in relation to certain preferred embodiments, obvious equivalent modifications and alterations thereof will become apparent to one of ordinary skill in this art after reading and understanding this specification and the claims appended hereto. This includes the subject matter defined by any combination of any one of the various claims appended hereto with any one or more of the remaining claims, including the incorporation of the features of any dependent claim, singly or in combination with other dependent claims into any independent claim, either alone or in combination with the features or limitations of any other independent claim, with the remaining dependent claims in their original text being read and applied to and independent claim so modified. Further, it is to be understood that the use of the word "about" as a modifier for a numerical value includes the actual numerical value itself. for example, where the phrase "wherein x is about 1" or phrases of similar import are provided, such language includes the situation wherein x equals 1. The presently disclosed invention accordingly covers all such modifications, alterations, and permutations.

What is claimed is:

1. A composition of matter useful as a phosphor in light emitting diodes, which comprises a material described by the formula:

$$MA_2(S_xSe_y)_4\text{:B}$$

in which:
   M comprises one or more elements selected from the group consisting of: Be, Mg, Ca, Sr, Ba, Zn;
   A comprises one or more elements selected from the group consisting of: Al, Ga, In, Y, La, and Gd;
   B comprises one or more elements selected from the group consisting of: Eu, Ce, Cu, Ag, Al, Tb, Cl, Br, F, I, Mg, Pr, K, Na, and Mn,
wherein B is present in any amount between 0.0001% and about 10% in mole percent based on the total molar weight of said composition, and wherein x and y are each independently any value between 0 and 1, subject to the proviso that the sum of x and y is equal to any number in the range of between about 0.75 and about 1.25.

2. A composition according to claim 1 wherein 0<x<1 and 0<y<1.

3. A composition according to claim 1 wherein $0.5 \leq x < 1$ and $0 < y \leq 0.5$.

4. A composition according to claim 1 wherein $0 < x \leq 0.5$ and $0 < y \leq 0.5$.

5. A composition according to claim 1 wherein $0 < x \leq 0.5$ and $0.5 \leq y < 1.0$.

6. A composition according to claim 1 wherein x is greater than 0, and y is about 1.

7. A composition according to claim 1 wherein x is about 1, and y is greater than 0.

8. A composition according to claim 1 wherein M comprises zinc and strontium.

9. A composition according to claim 8 having the formula $Zn_uSr_vGa_2(S_xSe_y)_4$:Eu in which u is about 0.71; v is about 0.29; x is about 0.615; and y is about 0.385.

10. A composition comprising at least two different phosphors according to claim 1.

11. A light emitting device comprising:
a) a light source selected from the group consisting of: light-emitting diodes and lasers, wherein said light source emits light having a wavelength of between about 360 and about 480 nanometers; and
b) a phosphor described by the formula:

$$MA_2(S_xSe_y)_4\text{:}B$$

in which:
M comprises one or more elements selected from the group consisting of: Be, Mg, Ca, Sr, Ba, Zn;
A comprises one or more elements selected from the group consisting of: Al, Ga, In, Y, La, and Gd;
B comprises one or more elements selected from the group consisting of: Eu, Ce, Cu, Ag, Al, Tb, Cl, Br, F, I, Mg, Pr, K, Na, and Mn,
wherein B is present in any amount between 0.0001% and about 10% in mole percent based on the total molar weight of said composition, and wherein x and y are each independently any value between 0 and 1, subject to the proviso that the sum of x and y is equal to any number in the range of between about 0.75 and about 1.25.

12. A light emitting device according to claim 11, wherein said phosphor emits white light when contacted with light having a wavelength of between about 360 and about 480 nanometers.

13. A light emitting device according to claim 11 comprising a mixture of at least two different phosphors described by said formula.

14. A light emitting device according to claim 13, wherein said mixture of phosphors emit white light when contacted with light having a wavelength of between about 360 and about 480 nanometers.

15. A light emitting device according to claim 11 which comprises a phosphor having the formula $Zn_uSr_vGa_2(S_xSe_y)_4$:Eu in which u is about 0.71; v is about 0.29; x is about 0.615; and y is about 0.385.

16. A composition of matter useful as a phosphor in light emitting diodes, which comprises a material described by the formula:

$$MA_4(S_xSe_y)_7\text{:}B$$

in which:
M comprises one or more elements selected from the group consisting of: Be, Mg, Ca, Sr, Ba, Zn;
A comprises one or more elements selected from the group consisting of: Al, Ga, In, Y, La, and Gd;
B comprises one or more elements selected from the group consisting of: Eu, Ce, Cu, Ag, Al, Tb, Cl, Br, F, I, Mg, Pr, K, Na, and Mn,
wherein B is present in any amount between 0.0001% and about 10% in mole percent based on the total molar weight of said composition, and wherein x and y are each independently any value between 0 and 1, subject to the proviso that the sum of x and y is equal to any number in the range of between about 0.75 and about 1.25.

17. A composition according to claim 16 wherein $0<x<1$ and $0<y<1$.

18. A composition according to claim 16 wherein $0.5 \leq x<1$ and $0<y \leq 0.5$.

19. A composition according to claim 16 wherein $0<x \leq 0.5$ and $0<y \leq 0.5$.

20. A composition according to claim 16 wherein $0<x \leq 0.5$ and $0.5 \leq y<1.0$.

21. A composition according to claim 16 wherein x is greater than 0, and y is about 1.

22. A composition according to claim 16 wherein x is about 1, and y is greater than 0.

23. A composition according to claim 16 having the formula $Ba_uSr_vGa_4(S_xSe_y)_7$:Eu in which u is about 0.78, v is about 0.22, x is about 0.88; and y is about 0.12.

24. A composition comprising at least two different phosphors according to claim 16.

25. A light emitting device comprising:
a) a light source selected from the group consisting of: light-emitting diodes and lasers, wherein said light source emits light having a wavelength of between about 360 and about 480 nanometers; and
b) a phosphor described by the formula:

$$MA_4(S_xSe_y)_7\text{:}B$$

in which:
M comprises one or more elements selected from the group consisting of: Be, Mg, Ca, Sr, Ba, Zn;
A comprises one or more elements selected from the group consisting of: Al, Ga, In, Y, La, and Gd;
B comprises one or more elements selected from the group consisting of: Eu, Ce, Cu, Ag, Al, Tb, Cl, Br, F, I, Mg, Pr, K, Na, and Mn,
wherein B is present in any amount between 0.0001% and about 10% in mole percent based on the total molar weight of said composition, and wherein x and y are each independently any value between 0 and 1, subject to the proviso that the sum of x and y is equal to any number in the range of between about 0.75 and about 1.25.

26. A light emitting device according to claim 25, wherein said phosphor emits white light when contacted with light having a wavelength of between about 360 and about 480 nanometers.

27. A light emitting device according to claim 25 comprising a mixture of at least two different phosphors described by said formula.

28. A light emitting device according to claim 27, wherein said mixture of phosphors emit white light when contacted with light having a wavelength of between about 360 and about 480 nanometers.

29. A light emitting device according to claim 25 which comprises a phosphor having the formula $Ba_uSr_vGa_4(S_xSe_y)_7$:Eu in which u is about 0.78, v is about 0.22, x is about 0.88; and y is about 0.12.

30. A composition of matter useful as a phosphor in light emitting diodes, which comprises a material described by the formula:

$$(M1)_m(M2)_nA_p(S_xSe_y)_q\text{:}B$$

in which:
M1 comprises an element selected from the group consisting of: Be, Mg, Ca, Sr, Ba, Zn;
M2 comprises an element selected from the group consisting of: Be, Mg, Ca, Sr, Ba, Zn which is different from M1;
A comprises one or more elements selected from the group consisting of: Al, Ga, In, Y, La, and Gd;
B comprises one or more elements selected from the group consisting of: Eu, Ce, Cu, Ag, Al, Tb, Cl, Br, F, I, Mg, Pr, K, Na, and Mn;

wherein p can be either about 2 or about 4, and q can be either about 4 or about 7, subject to the provisos that when p is about 2, q is about 4 and when p is about 4, q is about 7;

wherein x and y are each independently any value between 0 and 1, subject to the provisos that the sum of x and y is equal to any number in the range of between about 0.75 and about 1.25, the sum of m and n is about 1; and wherein B is present in any amount between 0.0001% and about 10% in mole percent based on the total molar weight of said composition.

31. A composition according to claim 30 wherein $0<x<1$ and $0<y<1$.

32. A composition according to claim 30 wherein $0.5 \leq x<1$ and $0<y \leq 0.5$.

33. A composition according to claim 30 wherein $0<x \leq 0.5$ and $0<y \leq 0.5$.

34. A composition according to claim 30 wherein $0<x \leq 0.5$ and $0.5 \leq y<1.0$.

35. A composition according to claim 30 wherein x is greater than 0, and y is about 1.

36. A composition according to claim 30 wherein x is about 1, and y is greater than 0.

37. A composition according to claim 30 wherein M comprises zinc and strontium.

38. A composition comprising at least two different phosphors according to claim 30.

39. A light emitting device comprising a phosphor according to claim 30.

40. A light emitting device according to claim 39, wherein said phosphor emits white light when contacted with light having a wavelength of between about 360 and about 480 nanometers.

41. A light emitting device according to claim 39 comprising a mixture of at least two different phosphors described by said formula.

42. A light emitting device according to claim 41, wherein said mixture of phosphors emit white light when contacted with light having a wavelength of between about 360 and about 480 nanometers.

* * * * *